(12) United States Patent
de Rauw et al.

(10) Patent No.: US 9,463,595 B2
(45) Date of Patent: Oct. 11, 2016

(54) PROCESSING APPARATUS FOR PROCESSING A FLEXOGRAPHIC PLATE, A METHOD AND A COMPUTER PROGRAM PRODUCT

(71) Applicant: XEIKON I.P. B.V., Eede (NL)

(72) Inventors: Dirk de Rauw, Eede (NL); Bart Marc Luc Wattyn, Eede (NL)

(73) Assignee: XEIKON PREPRESS N.V., Ieper (BE)

( * ) Notice: Subject to any disclaimer, the term of this patent is extended or adjusted under 35 U.S.C. 154(b) by 0 days.

(21) Appl. No.: 14/091,440

(22) Filed: Nov. 27, 2013

(65) Prior Publication Data
US 2014/0147791 A1     May 29, 2014

(30) Foreign Application Priority Data

Nov. 28, 2012 (EP) .................................. 12194553

(51) Int. Cl.
    *G03F 7/20*        (2006.01)
    *B29C 59/16*      (2006.01)
    *G03F 7/213*       (2006.01)

(52) U.S. Cl.
    CPC ................ *B29C 59/16* (2013.01); *G03F 7/20* (2013.01); *G03F 7/202* (2013.01); *G03F 7/213* (2013.01)

(58) Field of Classification Search
    CPC ......... B29C 59/16; G03F 7/20; G03F 7/202; G03F 7/213
    USPC .......................................................... 377/67
    See application file for complete search history.

(56) References Cited

U.S. PATENT DOCUMENTS

| | | | |
|---|---|---|---|
| 4,132,168 A | 1/1979 | Peterson | |
| 5,353,705 A | 10/1994 | Lewis et al. | |
| 5,925,500 A * | 7/1999 | Yang et al. | 430/300 |
| 2002/0018963 A1* | 2/2002 | Yang et al. | 430/273.1 |
| 2010/0028815 A1* | 2/2010 | Zwadlo | 430/325 |
| 2011/0104615 A1* | 5/2011 | Sievers | 430/300 |
| 2013/0337386 A1* | 12/2013 | De Rauw et al. | 430/306 |

FOREIGN PATENT DOCUMENTS

| | | |
|---|---|---|
| FR | 2 258 649 | 8/1975 |
| WO | WO 01/63364 | 8/2001 |
| WO | WO 2009/033124 | 3/2009 |
| WO | WO 2009033124 A2 * | 3/2009 |

* cited by examiner

*Primary Examiner* — Chanceity Robinson
(74) *Attorney, Agent, or Firm* — Preti Flaherty Beliveau & Pachios LLP

(57) ABSTRACT

The invention relates to a processing apparatus for processing a flexographic plate. The apparatus comprises a supporting unit for supporting a flexographic plate including a relief layer containing a photosensitive material, the plate further including, on the relief layer, a carbon layer that is impenetrable for UV light. The apparatus also comprises an optical system for locally ablating the carbon layer for forming a pattern in the carbon layer that is penetrable for UV light, and for polymerizing at least a top part of the relief layer under the carbon pattern layer. Thereto, the optical system includes a single radiation source for both locally ablating the carbon layer and for polymerizing at least a top part of the relief layer.

3 Claims, 3 Drawing Sheets

PROCESSING APPARATUS FOR PROCESSING A FLEXOGRAPHIC PLATE, A METHOD AND A COMPUTER PROGRAM PRODUCT

TECHNICAL FIELD

The invention relates to a processing apparatus for processing a flexographic plate, the apparatus comprising a supporting unit for supporting a flexographic plate including a relief layer containing a photosensitive material and a carrier layer carrying the relief layer, the plate further including, on the relief layer, a carbon layer that is impenetrable for UV light, the apparatus further comprising an optical system that is arranged for locally ablating the carbon layer for forming a pattern in the carbon layer that is penetrable for UV light, and for polymerizing at least a top part of the relief layer under the carbon pattern layer.

BACKGROUND

Flexographic plates serve as printing plates in a variety of applications. As an example, flexographic plates can be used for printing patterns on plastic bags, such as bags containing food products. Further, flexographic printing can be applied on relief material, such as labels, card board for packaging products and corrugated (card)board or paper.

Prior to an actual printing phase, a fresh flexographic plate is processed for making a desired relief pattern, including a step of providing a floor layer on top of the carrier layer and including a step of imaging photosensitive material in the relief layer of the plate, using a mask technology, such that said material locally polymerizes. Then, un-polymerized material is removed in a washing/cleaning process, so that the polymerized relief pattern is left behind and protrudes upwardly from the carrier layer and from the floor layer. The process may include either a water based washing process, a solvent based washing process, or a heating process. During the printing process, the protruding pattern contacts a surface to be printed. The height of the relief pattern structure on the plate serves to selectively pick up ink and transfer it to the material to be printed. The substantial advantages of flexo printing are the flexibility in printing materials and the simplicity and stability of the printing process on less sophisticated printing machines than necessary for the offset printing process.

The optical system of a known processing apparatus includes an IR (infra red) light source, for generating IR light, typically at a wavelength of circa 830, nm, circa 940 nm or circa 1070 nm, for locally ablating the carbon layer to form a mask. The IR light source is e.g. a high power IR laser to enable carbon particles of the carbon layer to evaporate. The optical system of a known processing apparatus also includes a UV light source, such as a transluminance lamp, for causing the photosensitive material in the relief layer to start a polymerization process upon incidence of a UV light beam, typically UVA, UVB and UVC. The UV light propagates into the relief layer after transmission through mask apertures.

It has been observed that, in the process of forming the carbon mask, impurities may be encapsulated in the photosensitive material causing optical loss of quality during imaging. Among others, oxygen particles may diffuse into the relief layer causing a termination of a polymerization process that has been initiated by the UV light beam. This process is known as oxygen inhibition. Since additional oxygen particles may enter the relief layer, via the mask, the final polymerized structure will not reach its full height. Especially near the top of the polymerized structure and near boundaries of the mask apertures, incomplete polymerization may occur, thus developing polymerized structures having a moderately defined top profile. As an example, a square dot image is printed by a pillar, in the relief pattern, having a top profile approaching a semi sphere. Generally, the top profile is not flat but includes a rounded, curved surface causing inferior printing features.

Relief structures including curved, rounded top segments have a number of disadvantages. The area that is printed with such relief patterns depends on the pressure that is exerted when bringing the flexographic plate in contact with the substrate to be printed. Generally, when the pressure force increases, also the printed area increases, thus allowing visible variations on the printed substrate when printing parameters are within a reasonable range of operation. During life time of the flexographic plate, wear of the relief pattern modifies the printing area considerably since the contact area between the flexographic plate and the surface to be printed increases over time.

In prior art systems, different approaches are known to cope with the above-mentioned effects. As an example, lamination techniques are applied. Also, oxygen is removed from the atmosphere during curing conditions. Further, a high intensity UV surface crosslinking process is induced by applying high power UV radiation sources. However, all these approaches inherently have other drawbacks such as sensitivity to dust, complex, expensive devices etc.

BRIEF SUMMARY

It is an object of the invention to provide a processing apparatus according to the preamble, wherein at least one disadvantage identified above is reduced. In particular, the invention aims at obtaining an alternative processing apparatus wherein the effect of oxygen inhibition is counteracted. Thereto, according to an aspect of the invention, the optical system of the apparatus includes a single radiation source for both locally ablating the carbon layer and for polymerizing at least a top part of the relief layer.

By applying the locally ablating process and the polymerizing process in at least a top part of the relief layer, oxygen inhibition hardly occurs. Then, the top profile of the relief pattern is more flat, having clear edges between a top surface and a side surface of the relief pattern. Therefore, a tremendous improvement of print quality is obtained. Further, the operational low gain tolerances are much better, i.e. the relief pattern is significantly less impression sensitive, providing a more stable printing result. Also, the effects of wear of the relief pattern are less visible. Almost a 1:1 image transfer from the relief structure to the substrate to be printed is can be reached. In addition, an extended gamut is obtained due to the reproduction of finer highlights. Also, the processing speed can be improved when making the relief pattern in the flexographic plates. These advantages can be obtained while maintaining a relatively simple construction of the processing apparatus.

Preferably, the radiation source for both locally ablating the carbon layer and for polymerizing at least a top part of the relief layer, is implemented as a high power violet laser unit, a high power LTV laser unit, a laser diode or a LED operating at wavelengths causing polymerization of the photosensitive material and having enough power to cause carbon particles to evaporate.

The invention also relates to a method for processing a flexographic plate.

Further, the invention relates to a computer program product. A computer program product may comprise a set of computer executable instructions stored on a data carrier, such as a flash memory, a CD or a DVD. The set of computer executable instructions, which allow a programmable computer to carry out the method as defined above, may also be available for downloading from a remote server, for example via the Internet.

Other advantageous embodiments according to the invention are described in the following claims.

BRIEF DESCRIPTION OF DRAWINGS

By way of example only, embodiments of the present invention will now be described with reference to the accompanying figures in which.

The figures are merely schematic views of preferred embodiments according to the invention. In the figures, the same reference numbers refer to equal or corresponding parts.

DETAILED DESCRIPTION

Figure 1:
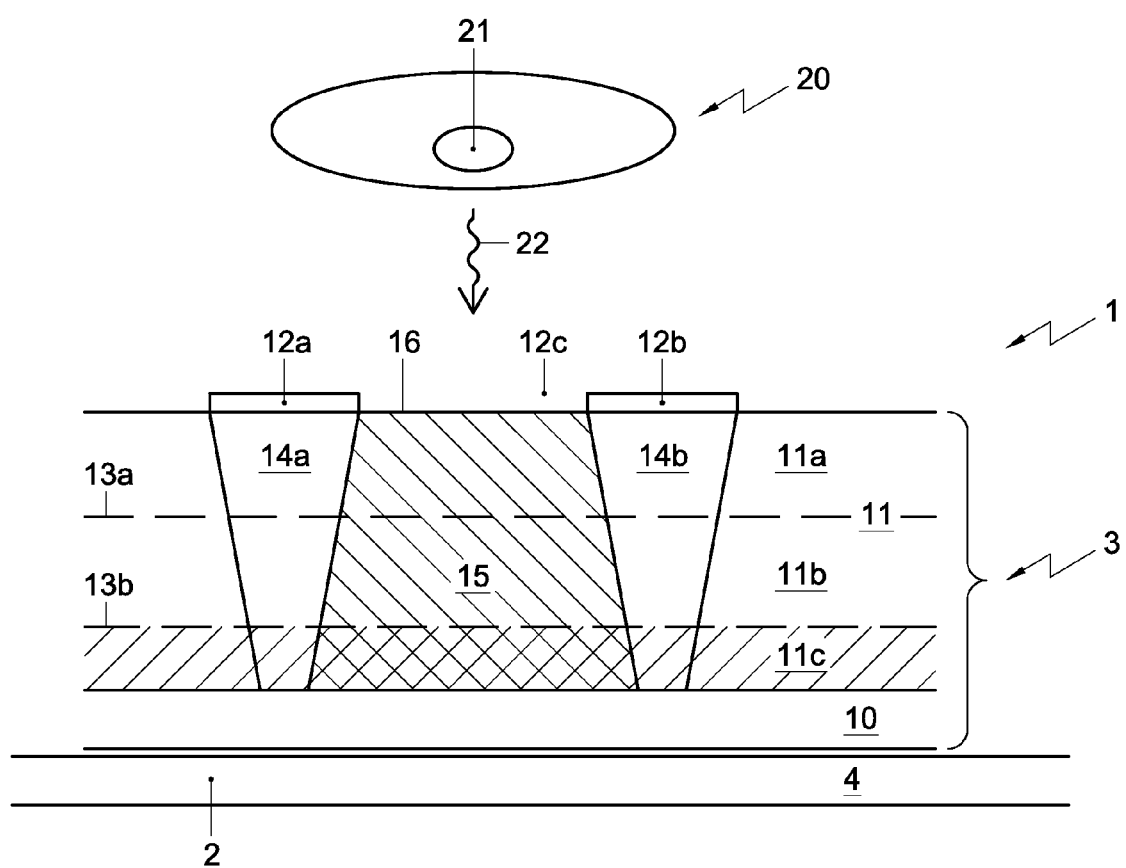
FIG. 1 shows a schematic cross sectional side view of a processing apparatus according to the invention.

FIG. 1 shows a cross sectional side view of a processing apparatus 1 according to the invention. The apparatus includes a supporting unit 2 for supporting a flexographic plate 3. The supporting unit 2 includes a table 4 optionally provided with a radiation transparent window for illuminating the flexographic plate 3. Alternatively, the supporting unit 2 includes other members for supporting the plate 3. Further, the supporting unit 2 may include rollers and/or vacuum fixation members for fixing the plate 3.

The flexographic plate 3 includes a carrier layer 10 providing a rigid, stable structure for the plate 3 as a whole. Thereto, the carrier layer 10 is composed of a relatively stiff material. The plate 3 further includes a relief layer 11 containing a photosensitive material. The photosensitive material is sensitive to radiation of specific wavelength. The relief layer 11 is formed on top of the carrier layer 10. The plate also includes, on the relief layer 11, a carbon layer 12 that is impenetrable for UV light. Initially, the carbon layer 12 is distributed in a uniform manner, covering the relief layer 11. The relief layer 11 is thus sandwiched between the carrier layer 10 and the carbon layer 12.

A bottom part of the relief layer 11, adjacent to the carrier layer 10, has been formed as a floor layer 11c by backwardly exposing the relief layer 11 to radiation causing said material to polymerize. In this process, the plate 3 is irradiated via the carrier layer 10. The floor layer 11c has a more or less constant thickness for providing additional stiffness to the plate 3.

Upon radiating further portions of the relief layer 11, from the side of the carbon layer 12, at pre-defined locations 15, a polymerization process initiates, thus modifying mechanical properties of the relief layer. Other, non-irradiated locations 14a,b of the relief layer 11 remain un-polymerized, and can be removed by performing a washing step. Then, a relief layer 11 is obtained having a rigid structure with a desired relief pattern. The pattern includes local relief parts 15 that protrude upwardly from the floor layer 10. The flexographic plate 3 can be used for printing the relief pattern on a substrate, such as corrugated cardboard.

The processing apparatus 1 further has an optical system 20 that is arranged for locally ablating the carbon layer 12 for forming a pattern in the carbon layer 12 that is penetrable for UV light, and for polymerizing at least a top part 11a of the relief layer 11 under the carbon pattern layer 12. The optical system includes a single radiation source 21 for both locally ablating the carbon layer and for polymerizing at least a top part of the relief layer. For performing the ablating step and the polymerizing step, the single radiation source 21 radiates radiation 22.

By irradiating the uniformly distributed virgin carbon layer 12, carbon particles are locally removed, thus forming a carbon pattern having a pre-defined distribution including apertures 12c and carbon regions 12a,b locally covering the surface 16 of the relief layer 11. The carbon pattern layer 12 now forms a mask enabling local irradiation of the relief layer 11. By irradiating the relief layer parts 15 below the apertures 12c in the carbon layer 12, these regions polymerize forming the local rigid relief parts 15 of a desired relief pattern in the relief layer 11.

During operation of the single radiation source 21, a local radiation beam is generated forming a spot on the carbon layer 12, so that the carbon particles in said spot evaporate. Then, the relief layer directly below said removed carbon is exposed to the same local radiation beam. The exposure of the relief layer is maintained until at least a top part 11a of the relief layer 11 polymerizes. In a single processing step, both the carbon mask 12 is formed and the polymerization process in at least a top part 11a of the relief layer 11 is initiated.

As a result, the geometry of the local relief parts 15 is generally well defined. Especially, the top segment of the relief parts 15 are shaped as flat top dots, enabling efficient ink transfer and laydown in solids, almost 1:1 image transfer to a substrate to be printed and low dot gain tolerances.

Advantageously, the single radiation source 21 is implemented as a high power violet laser unit, a high power UV laser unit, a laser diode or a LED. Preferably, the radiation source 21 operates at a wavelength of about 405 nm or in a wavelength spectrum below circa 405 nm. The power of the radiation source 21 is selected such that carbon particles evaporate upon exposure to radiation impinging of said source.

The optical system 20 further includes a LTV light source (not shown) for polymerizing a subsequent part 11b of the relief layer 11, also called middle part 11b, under the carbon pattern layer 12 and the top part 11a, after polymerization of at least the top part 11a of the relief layer 11. In FIG. 1 the top part 11a and the middle part 11b of the relief layer 11 are separated by a first dashed line 13a. The separation between the middle part 11b and bottom part 11c of the relief layer 11, forming the floor layer, is indicated by a second dashed line 13b. The top part 11a, the middle part 11b and the bottom part 11c form subsequent layers in the plate 3 and compose the complete relief layer 11. The middle part 11b is thus polymerized after polymerization of the top part 11a. Alternatively, the top part 11a and the middle part 11b are polymerized by the single radiation source that also locally ablates the carbon layer 12, e.g. if the total thickness of the top part 11a and the middle part 11b is relatively small.

The thickness of the top part 11a can be equal to the thickness of the middle part 11b and/or the bottom part 11c of the relief layer 11. However, the thickness ratio may deviate from 1:1:1. As an example, the thickness ratio is 5:1:1, 1:1:5 or 1:5:1.

Figure 2:
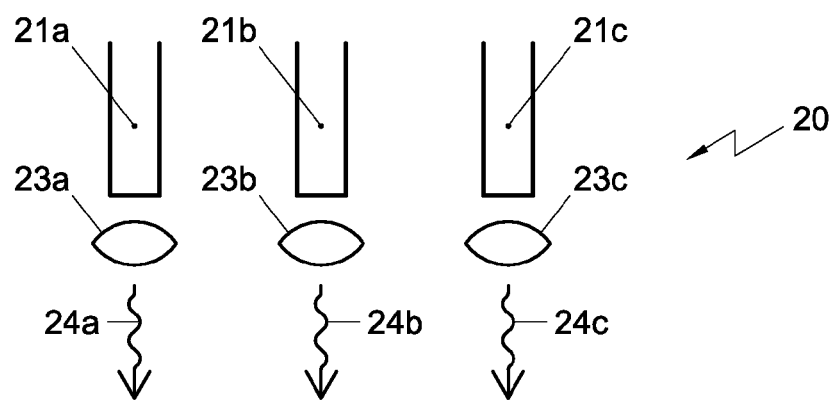
FIG. 2 shows a schematic side view of a first embodiment of an optical system included in a processing apparatus according to the invention.

FIG. 2 shows a schematic side view of a first embodiment of an optical system 20 included in a processing apparatus 1 according to the invention. The optical system 20 includes a multiple number of radiation sources 22a-c, each of them being arranged for both locally ablating the carbon layer 12 and for polymerizing at least a top part 11a of the relief layer 11 under the carbon pattern layer 12. The optical system 20 also includes an array of micro lenses 23a-c for directing the radiation emanating from the radiation sources 22a-c into respect beams 24a-c. The micro lenses 23a-c are positioned in line with the corresponding radiation sources 22a-c for projecting corresponding spots on the flexographic plate 3.

The multiple number of radiation sources are positioned in a one-dimensional or two-dimensional array, e.g. in a regular pattern. However, the radiation sources can also be placed in an irregular pattern. The radiation sources, e.g. implemented as high power laser diodes, are digitally controlled by a digital controller in accordance with a predetermined pattern to be made in the carbon layer 12. As an example, the radiation sources can be modulated in power and/or time for generating the desired spots on the carbon layer 12 and in the at least top part 11a of the relief layer 11. When the radiation sources are arranged in an irregular pattern, interleaving techniques can be applied to process an entire surface of the flexographic plate 3, e.g. by moving the flexographic plate with respect to the radiation sources.

It is noted that, in principle, the number of radiation sources can be selected as desired, e.g. depending on a desired processing speed. As an example, the number of radiation sources may range to 10 or more, e.g. 100 radiation sources. However, in principle, it is also possible to implement merely a single radiation source for both locally ablating the carbon layer 12 and polymerizing at least a top part 11a of the relief layer 11.

Figure 3:
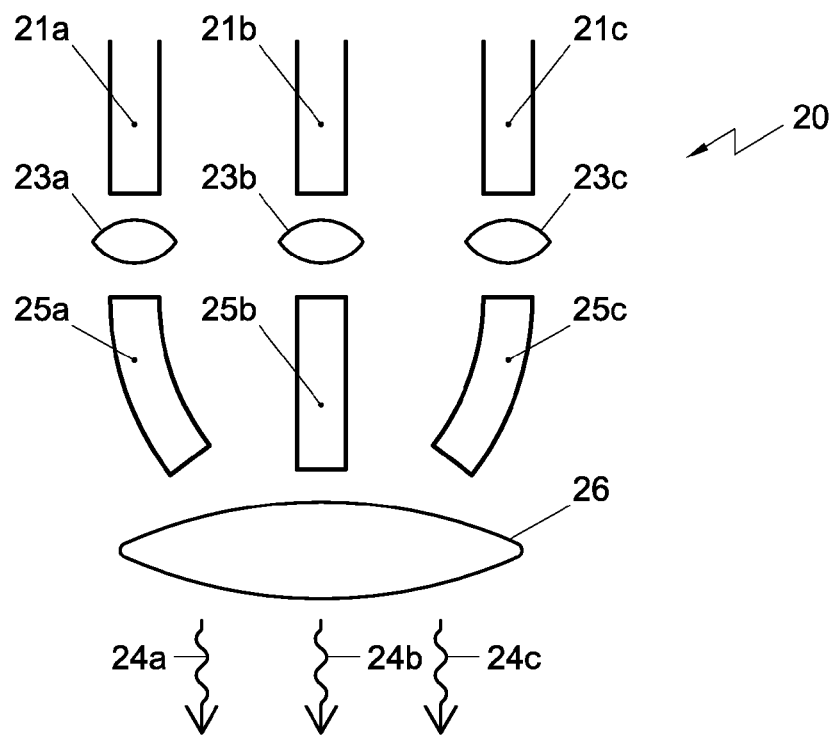
FIG. 3 shows a schematic side view of a second embodiment of an optical system included in a processing apparatus according to the invention.

FIG. 3 shows a schematic side view of a second embodiment of an optical system 20 included in a processing apparatus 1 according to the invention. Here, the beams projected by the micro lenses 23a-c are focused into waveguides 25a-c comprised by the optical system 20 for guiding the generated beams towards the surface flexographic plate 3. The waveguides 25a-c can e.g. be implemented as fibers, e.g. arranged in a specific structure such as a V groove or another structure. The optical system 20 further includes a further lens 26 for projecting the beams departing from the individual waveguides 25a-c as individual beams on the surface 16 of the flexographic plate 3. The optical system 20 shown in FIG. 3 has the advantage that many micro spots can be projected on a relatively small surface area of the flexographic plate 3.

Figure 4:
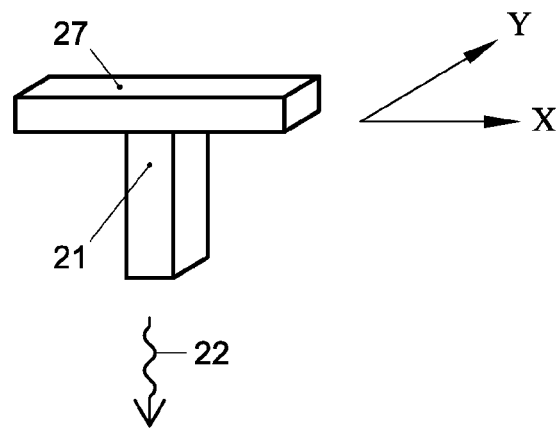
FIG. 4 shows a schematic side view of a third embodiment of an optical system included in a processing apparatus according to the invention.

FIG. 4 shows a schematic side view of a third embodiment of an optical system 20 included in a processing apparatus 1 according to the invention. Here, a single radiation source 21 is shown, e.g. a high power laser source, mounted on a spatial modulator unit 27 of the optical system for moving the radiation source 21 in a x-direction and/or y-direction, transverse to the propagation direction of the radiation 22 generated by the radiation source 21. In principle, the optical system 20 may include a multiple number of spatial modulators carrying a single radiation source for changing its position in a direction transverse to the propagation direction of the radiation beam. Further, a multiple number of radiation sources may be carried by a spatial modulator unit 27.

Figure 5:
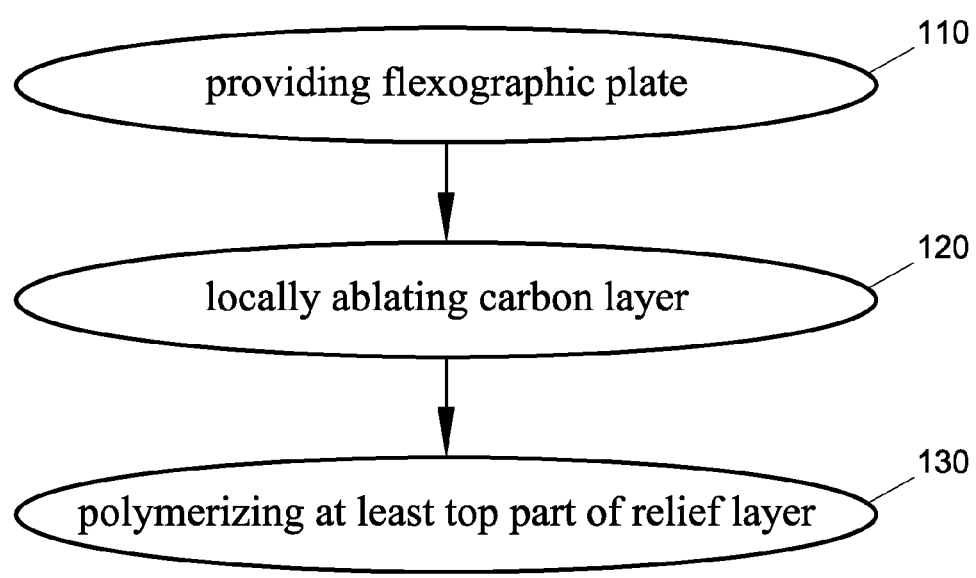
FIG. 5 shows a flow chart of an embodiment of a method according to the invention.

FIG. 5 shows a flow chart of an embodiment of the method according to the invention. The method is used for processing flexographic plates. The method comprises a step of providing 110 a flexographic plate 3 including a relief layer 11 containing a photosensitive material, the plate 3 further including, on the relief layer 11, a carbon layer 12 that is impenetrable for UV light, a step of locally ablating 120 the carbon layer 12 by exposure to radiation for forming a pattern in the carbon layer 12 that is penetrable for UV light, and a step of polymerizing 130 at least a top part of the relief layer 11 under the carbon pattern layer 12 by exposure to a radiation, wherein a single radiation source 21 is used for both locally ablating the carbon layer 12 and for polymerizing at least a top part 11a of the relief layer 11.

The method of processing flexographic plates can be executed using dedicated hardware structures, such as FPGA and/or ASIC components. Otherwise, the method can also at least partially be performed using a computer program product comprising instructions for causing a processor of a computer system or a control unit to perform the above described steps of the method according to the invention. The instructions may include specific instructions for controlling the first and the second radiation source, being the same radiation source. All (sub)steps can in principle be performed on a single processor. However, it is noted that at least one step can be performed on a separate processor, e.g. the step of locally ablating 120 the carbon layer.

The invention is not restricted to the embodiments described herein. It will be understood that many variants are possible.

A number of further processing steps can be performed, e.g. a step of post illuminating the relief layer.

It is noted that a flexographic plate processed according to the above-defined steps is in principle applicable to various printing systems, e.g. for printing on flat or curved substrates. Further, the flexographic plate can be applied in combination with an external or internal drum.

Other such variants will be apparent for the person skilled in the art and are considered to fall within the scope of the invention as defined in the following claims.

What is claimed is:

1. A processing apparatus for processing a flexographic plate, comprising:
   a supporting unit configured to support a flexographic plate including a relief layer composed of a top part, a middle part and a bottom part forming subsequent layers in the plate, the relief layer containing a photosensitive material, the plate further including, on the relief layer, a carbon layer that is impenetrable for UV light, and
   an optical system configured to locally ablating the carbon layer for forming a pattern in the carbon layer that is penetrable for UV light, and to polymerize at least the top part of the relief layer under the carbon pattern layer,
   wherein the optical system includes at least one radiation source configured to generate a single radiation beam to both locally ablate the carbon layer and polymerize at least the top part of the relief layer.

2. An apparatus according to claim 1, wherein the optical system further comprises an array of micro lenses for directing radiation emanating from the at least one radiation source into respective beams.

3. An apparatus according to claim 2, wherein the array of micro lenses is configured to direct the respective beams into respective waveguides, and wherein the optical system further includes a further lens for directing beams emanating from the waveguides onto the carbon layer.

\* \* \* \* \*